(12) United States Patent
Olsen (10) Patent No.: US 8,638,130 B1
(45) Date of Patent: Jan. 28, 2014

(54) LOW HEADROOM LINE DRIVER

(75) Inventor: Espen Olsen, Tustin, CA (US)

(73) Assignee: Entropic Communications, Inc., San Diego, CA (US)

( * ) Notice: Subject to any disclaimer, the term of this patent is extended or adjusted under 35 U.S.C. 154(b) by 304 days.

(21) Appl. No.: 13/029,957

(22) Filed: Feb. 17, 2011

Related U.S. Application Data (60) Provisional application No. 61/305,283, filed on Feb. 17, 2010.

(51) Int. Cl.
*H03B 1/00* (2006.01)

(52) U.S. Cl.
USPC .......................................... 327/108; 327/109

(58) Field of Classification Search
USPC .................................. 327/108, 112, 109–111
See application file for complete search history.

(56) References Cited

U.S. PATENT DOCUMENTS

| | | | |
|---|---|---|---|
| 5,939,904 A * | 8/1999 | Fetterman et al. | 327/67 |
| 6,683,487 B2 * | 1/2004 | Takeuchi et al. | 327/423 |
| 7,696,793 B2 * | 4/2010 | Sunairi | 327/108 |

* cited by examiner

*Primary Examiner* — Hai L Nguyen
(74) *Attorney, Agent, or Firm* — Bruce Greenhaus; Richard Bachand; KPPB LLP (57) ABSTRACT

Low headroom line driver circuits are disclosed. In several embodiments, the line driver circuits include a first transistor, a second transistor, a third transistor and a fourth transistor, where the first transistor and second transistors; and the third and fourth transistors are matched, first and second matched impedances, first and second driver controls circuit configured to apply control signals to the gates of the first and second transistors; and the third and fourth transistors respectively. In addition, the first and third transistors; and the second and fourth transistors are configured as a pair of stacked transistors connected between the voltage supplies Vdd and Vss, the second and fourth transistors are configured as a pair of stacked transistors connected between the voltage supplies Vdd and Vss, the matched impedances are connected in series between nodes formed by the connection between the first and third transistors; and the second and fourth transistors.

15 Claims, 8 Drawing Sheets

LOW HEADROOM LINE DRIVER

CROSS-REFERENCES TO RELATED APPLICATIONS

The present invention claims priority to U.S. Provisional Application No. 61/306,283, entitled "Low Headroom Driver", filed Feb. 17, 2010, the disclosure of which is incorporated herein by reference in its entirety.

FIELD OF THE INVENTION

The present invention relates generally to line driver circuits and more specifically to line driving circuits that self-regulate output voltage swing and output common mode voltage.

BACKGROUND

Figure 1:
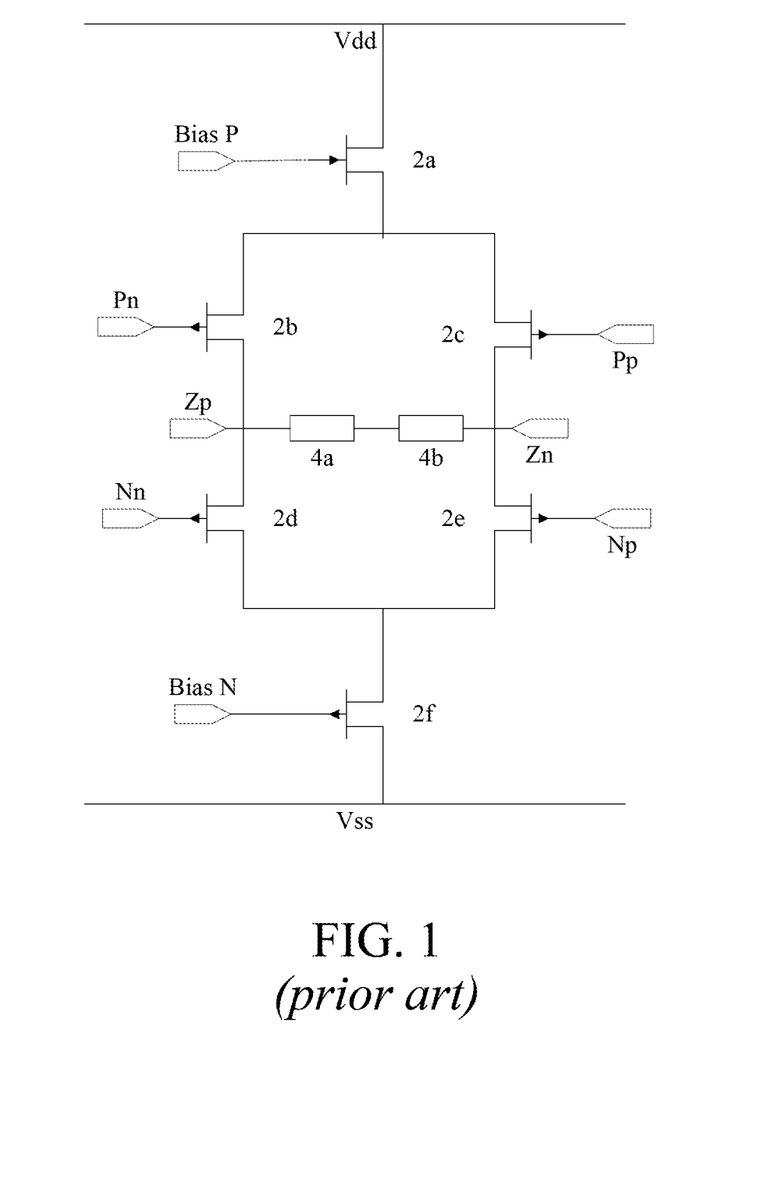
FIG. 1 is a semi-schematic circuit diagram of a prior art line driver circuit.

Line driver circuits are used to translate digital data into an analog waveform on a wire or antenna. In many instances, the output of the line driver circuit generates a voltage corresponding to the digital data. A common line driver circuit is shown in FIG. 1.

Transistors 2a and 2f regulate the total amount of current in the circuit as dictated by bias voltages Bias P and Bias N. Raising or lowering Bias P and Bias N increases or decreases the amount of total current flowing through the other 4 transistors, 2b, 2c, 2d and 2e.

Transistors 2b, 2c, 2d, and 2e are controlled by voltages Pn, Pp, Nn, and Np. These voltages are applied selectively to route current from the bias sources from node Zp towards node Zn or from node Zn to node Zp. When Pn and Np are asserted, transistors 2b and 2e are ON. At the same time, Pp and Nn are deasserted and transistors 2c and 2d are OFF. The current from bias source 2a is routed down through 2b, across 4a, across 4b, down through 2e and then down through 2f. Voltage measured across Zp-Zn will result in a positive value.

Conversely, when Pp and Nn are asserted, transistors 2c and 2d are ON. At the same time, Pn and Np are deasserted and transistors 2b and 2e are OFF. The current from bias source 2a is routed down through 2c, across 4b, across 4a, down 2d and then down through 2f. Voltage measured across Zp-Zn will result in a negative value.

Headroom is defined as the required potential difference between voltage supplies Vdd and Vss. Because each transistor requires a minimum voltage across its source and drain, stacking transistors requires a minimum headroom. For the example shown in FIG. 1, there are 4 transistors, {2a, 2b, 2e, 2f} or {2a, 2c, 2d, 2f} between Vdd and Vss.

Output swing is defined as the voltage swing between the output nodes. For example, in FIG. 1, the output nodes are defined as Zp and Zn. The current passing through elements 4a and 4b determines the voltage across Zp and Zn. The exact voltage is determined by the amount of current and the value of elements 4a and 4b.

Common mode voltage is defined as the average voltage between two nodes. For the circuit illustrated in FIG. 1 it is the average voltage between the output nodes Zp and Zn. Because elements 4a and 4b are matched, voltage between them can be considered the common mode voltage.

SUMMARY OF THE INVENTION

Low headroom line driver circuits in accordance with embodiments of the invention include two transistors in the current path between the voltage supplies Vdd and Vss. In several embodiments, the line driver circuits include a matched pair of impedances in the current path and are configured to regulate current flow through the impedances and the common mode voltage of the impedances. One embodiment of the invention includes a first transistor and a second transistor, where the first and second transistors are matched, a third transistor and a fourth transistor, where the third and fourth transistors are matched, a first impedance and a second impedance, where the first and second impedances are matched, a first driver control circuit configured to apply control signals to the gates of the first and second transistors in response to a digital input, and a second driver control circuit configured to apply control signals to the gates of the third and fourth transistors in response to the digital input. In addition, the first and third transistors are configured as a pair of stacked transistors connected between the voltage supplies Vdd and Vss, the second and fourth transistors are configured as a pair of stacked transistors connected between the voltage supplies Vdd and Vss, the matched impedances are connected in series between a node formed by the connection between the first and third transistors and a node formed by the connection between the second and fourth transistors, and the first driver control circuit and the second driver control circuit regulate the voltage drop across the pair of matched impedances and the common mode voltage at a node between the first and second impedances.

In a further embodiment, the first driver control circuit and the second driver control circuit are configured so that the first and fourth transistors form a current path between Vdd and Vss via the matched impedances when the digital input is a first value, and the first driver control circuit and second driver control circuit are configured so that the second and third transistors form a current path between Vdd and Vss via the matched impedances when the digital input is a second value.

In another embodiment, the first and second transistors are n-type FETs, and the third and fourth transistors are p-type FETs.

In a still further embodiment, the first and second transistors are p-type FETs, and the third and fourth transistors are n-type FETs.

In still another embodiment, the first driver control circuit and the second driver control circuit are configured to regulate the line driver circuit such that the current flowing through the impedances is matched to a reference current Iref and the common mode voltage is matched to a reference voltage Vref.

In a yet further embodiment, the first driver control circuit includes a current supply, a third impedance matched to the first and second impedances, and a fifth transistor matched to the first and second transistors, the current supply, third impedance, and fifth transistor are configured so that current flows from the current supply through the third impedance and the fifth transistor, and the fifth transistor controls the amount of current that flows through the third impedance and the fifth transistor, the first driver control circuit is configured to control the signal applied to the gate of the fifth transistor so that the current flowing through the third impedance and the fifth transistor matches Iref, and the first driver control circuit is configured to use the signal applied to the gate of the fifth transistor to control the magnitude of the signal applied to the gates of the first and second transistors in response to the digital input.

In yet another embodiment, the first driver control circuit further includes first and second variable gain amplifiers, where the first and second variable gain amplifiers are matched, the input to the first variable gain amplifier is the digital input, a first output of the first variable gain amplifier is configured to be provided to the gate of the first transistor, a second output of the first variable gain amplifier is configured to be provided to the gate of the second transistor, where the second output causes the second transistor to operate in an inverse manner to the first transistor, the output of the second variable gain amplifier is configured to be provided to the gate of the fifth transistor, the first driver control circuit is configured to control the signal applied to the gate of the fifth transistor by controlling the gain of the second variable gain amplifier, and the first driver control circuit is configured to control the gain of the first variable gain amplifier to match the gain of the second variable gain amplifier.

In a further embodiment again, the first driver control circuit further includes a comparator configured to compare the voltage drop across the third impedance and the fifth transistor to Vref.

In another embodiment again, the first, second, and fifth transistors are n-type FETs, the current supply is a current source, the first transistor is connected between the third transistor and the voltage supply Vss, the second transistor is connected between the fourth transistor and the voltage supply Vss, the first driver control circuit is configured to increase the gain of the second variable gain amplifier when the voltage drop across the third impedance and fifth transistor is less than Vref for a predetermined period of time, and the first driver control circuit is configured to decrease the gain of the second variable gain amplifier when the voltage drop across the third impedance and fifth transistor is greater than Vref for a predetermined period of time.

In a further additional embodiment, the third, and fourth transistors are p-type FETs, the second driver control circuit includes a variable gain amplifier and a comparator, the input to the variable gain amplifier is the digital input, a first output of the first variable gain amplifier is configured to be provided to the gate of the fourth transistor, a second output of the first variable gain amplifier is configured to be provided to the gate of the third transistor, where the second output causes the third transistor to operate in an inverse manner to the fourth transistor, the comparator is configured to compare the common mode voltage of the line driver circuit to Vref, the second driver control circuit is configured to control the gain of the variable gain amplifier to decrease the magnitude of the control signal applied to the gates of third and fourth transistors when the common mode voltage is greater than Vref for a predetermined period of time, and the second driver control circuit is configured to control the gain of the variable gain amplifier to increase the magnitude of the control signal applied to the gates of third and fourth transistors when the common mode voltage is less than Vref for a predetermined period of time.

In another additional embodiment, the first, second, and fifth transistors are p-type, the current supply is a current sink, the first transistor is connected between the voltage supply Vdd and the third transistor, the second transistor is connected between the voltage supply Vdd and the fourth transistor, the first driver control circuit is configured to decrease the gain of the second variable gain amplifier when the voltage drop across the third impedance and fifth transistor is less than Vref for a predetermined period of time, and the first driver control circuit is configured to increase the gain of the second variable gain amplifier when the voltage drop across the third impedance and fifth transistor is greater than Vref for a predetermined period of time.

In a still yet further embodiment, the third, and fourth transistors are n-type FETs, the second driver control circuit includes a variable gain amplifier and a comparator, the input to the variable gain amplifier is the digital input, a first output of the first variable gain amplifier is configured to be provided to the gate of the fourth transistor, a second output of the first variable gain amplifier is configured to be provided to the gate of the third transistor, where the second output causes the third transistor to operate in an inverse manner to the fourth transistor, the comparator is configured to compare the common mode voltage of the line driver circuit to Vref, the second driver control circuit is configured to control the gain of the variable gain amplifier to increase the magnitude of the control signal applied to the gates of third and fourth transistors when the common mode voltage is greater than Vref for a predetermined period of time, and the second driver control circuit is configured to control the gain of the variable gain amplifier to decrease the magnitude of the control signal applied to the gates of third and fourth transistors when the common mode voltage is less than Vref for a predetermined period of time.

In still yet another embodiment, the second driver control circuit includes a variable gain amplifier and a comparator, a first output of the first variable gain amplifier is configured to be provided to the gate of the fourth transistor, a second output of the first variable gain amplifier is configured to be provided to the gate of the third transistor, where the second output causes the third transistor to operate in an inverse manner to the fourth transistor, the comparator is configured to compare the common mode voltage of the line driver circuit to Vref, and the second driver control circuit is configured to control the magnitude of the signals applied to the gates of the third and fourth transistors so that the common mode voltage matches Vref.

In a still further embodiment again, the third, and fourth transistors are p-type FETs, the second driver control circuit is configured to control the gain of the variable gain amplifier to decrease the magnitude of the control signal applied to the gates of third and fourth transistors when the common mode voltage is greater than Vref for a predetermined period of time, and the second driver control circuit is configured to control the gain of the variable gain amplifier to increase the magnitude of the control signal applied to the gates of third and fourth transistors when the common mode voltage is less than Vref for a predetermined period of time.

In still another embodiment again, the third, and fourth transistors are n-type FETs, the second driver control circuit is configured to control the gain of the variable gain amplifier to increase the magnitude of the control signal applied to the gates of third and fourth transistors when the common mode voltage is greater than Vref for a predetermined period of time, and the second driver control circuit is configured to control the gain of the variable gain amplifier to decrease the magnitude of the control signal applied to the gates of third and fourth transistors when the common mode voltage is less than Vref for a predetermined period of time.

Another further embodiment includes a first transistor and a second transistor, where the first and second transistors are matched, a third transistor and a fourth transistor, where the third and fourth transistors are matched, a first impedance and a second impedance, where the first and second impedances are matched, a first driver control circuit configured to apply control signals to the gates of the first and second transistors in response to a digital input, and a second driver control circuit configured to apply control signals to the gates of the third and fourth transistors in response to the digital input. In addition, the first and third transistors are configured as a pair of stacked transistors connected between the voltage supplies Vdd and Vss, the second and fourth transistors are configured as a pair of stacked transistors connected between the voltage supplies Vdd and Vss, the matched impedances are connected in series between a node formed by the connection between the first and third transistors and a node formed by the connection between the second and fourth transistors, the first driver control circuit includes a current supply, a third impedance matched to the first and second impedances, and a fifth transistor matched to the first and second transistors, the current supply, third impedance, and fifth transistor are configured so that current flows from the current supply through the third impedance and the fifth transistor, and the fifth transistor controls the amount of current that flows through the third impedance and the fifth transistor, the first driver control circuit is configured to control the signal applied to the gate of the fifth transistor so that the current flowing through the third impedance and the fifth transistor matches Iref, the first driver control circuit is configured to use the signal applied to the gate of the fifth transistor to control the magnitude of the signal applied to the gates of the first and second transistors in response to the digital input, the second driver control circuit includes a variable gain amplifier and a comparator, a first output of the first variable gain amplifier is configured to be provided to the gate of the fourth transistor, a second output of the first variable gain amplifier is configured to be provided to the gate of the third transistor, where the second output causes the third transistor to operate in an inverse manner to the fourth transistor, the comparator is configured to compare the common mode voltage of the line driver circuit to Vref, and the second driver control circuit is configured to control the magnitude of the signals applied to the gates of the third and fourth transistors so that the common mode voltage matches Vref.

DETAILED DESCRIPTION OF THE INVENTION

Turning now to the drawings, low headroom line driver circuits in accordance with embodiments of the invention are illustrated. The line driver circuit includes two transistors in the current path between the voltage supplies Vdd and Vss, which provides lower overhead than circuits with more transistors in the current path. In many embodiments, the line driver circuits include driver control circuits that self-regulate output voltage and output common mode voltage based upon a reference current Iref and a reference voltage Vref. Low headroom line driver circuits and driver control circuitry in accordance with embodiments of the invention are discussed further below.

Low Headroom Line Drivers

Figure 2:
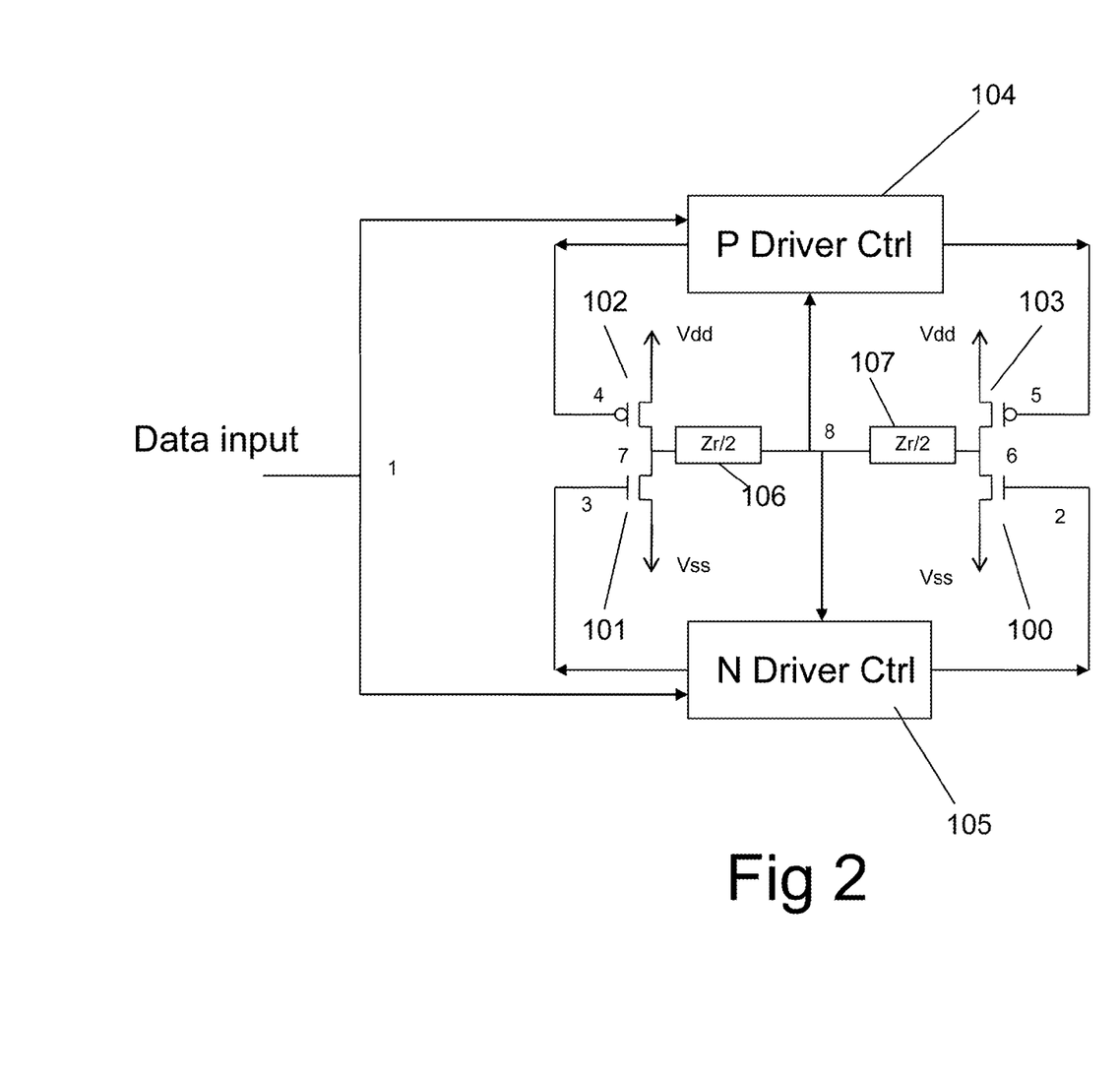
FIG. 2 is a semi-schematic circuit diagram of a low headroom line driver circuit in accordance with an embodiment of the invention.

A low headroom line driver circuit in accordance with an embodiment of the invention is illustrated in FIG. 2. The low headroom line driver circuit includes matched pairs of transistors 100, 101, and 102, 103 that are stacked 100, 103, and 101, 102. Current through the transistors 100, 101, 102, 103 is controlled by driver control circuits, which appropriately apply the correct voltage at each transistor's gate in order to source or sink the desired current. Separate driver control circuits are used for the PFET devices and the NFET devices.

Based on the data input at node 1 and the common mode voltage at node 8, the P driver control circuit, 104, controls voltages at the gates 4 and 5 of PFET transistors 102 and 103 respectively. The N driver control circuit 105, also using data input at node 1 and common mode voltage at node 8, controls voltages at the gates 2 and 3 of NFET transistors 100 and 101 respectively. Adjusting the gate voltages appropriately routes current across the impedance elements 106 and 107 such that the desired output voltage is produced between nodes 6 and 7. Additionally, the common mode voltage at node 8 can be controlled to a specific level.

NFET Driver Control Circuit

Figure 3:
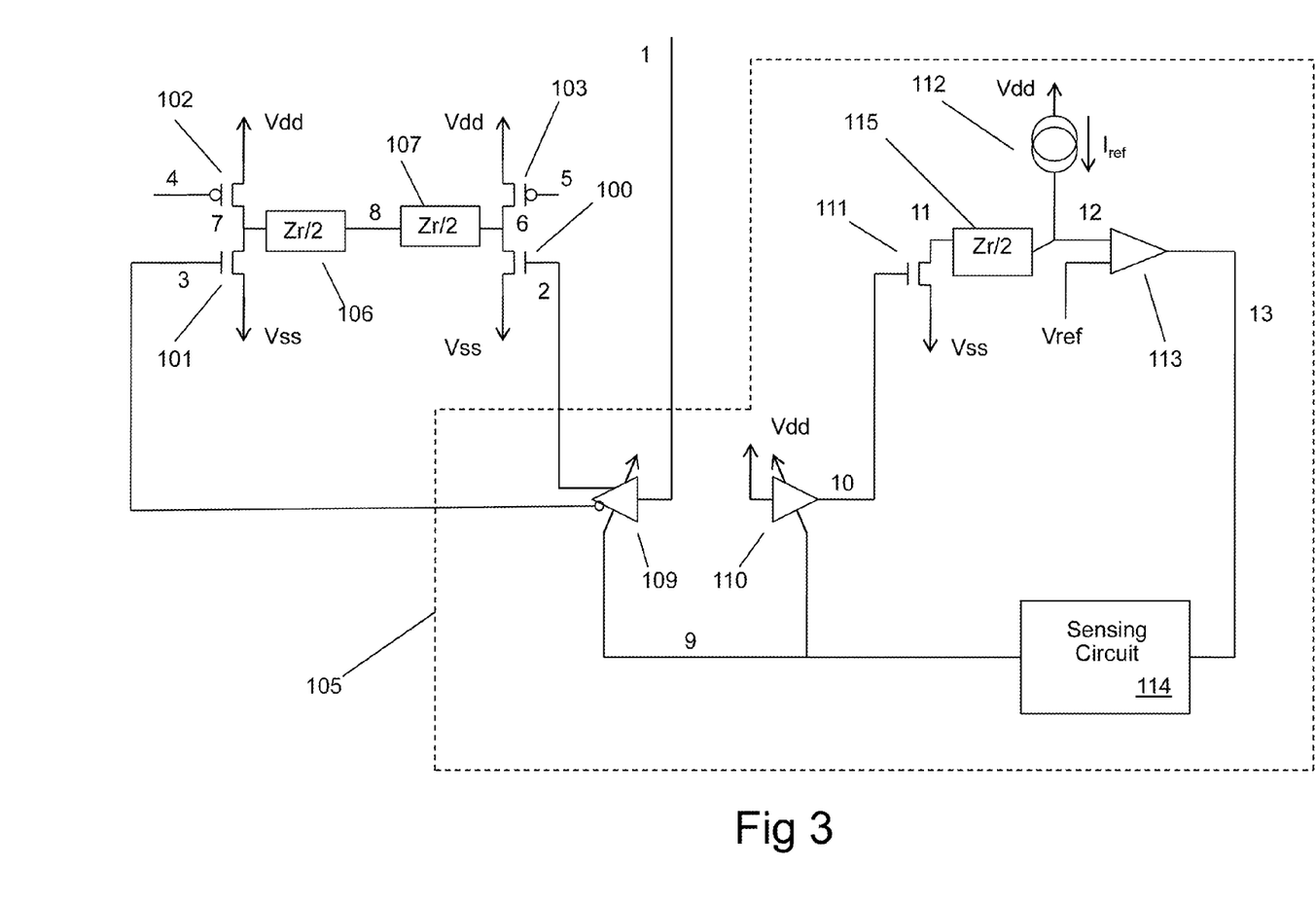
FIG. 3 is a semi-schematic circuit diagram of a line driver circuit illustrating a N driver control circuit in accordance with an embodiment of the invention.

FIG. 3 shows the line driver circuit with a more detailed view of the N driver control circuit, 105. In operation, the line driver circuit is configured to generate a positive or negative voltage across nodes 6 and 7 based upon an input sequence of 1's and 0's. In many embodiments, a 1 corresponds to a positive voltage across the load of Zr and a 0 corresponds to a negative voltage. In several embodiments, the inverse situation applies. To accommodate the user's desire for a specific voltage swing across the load Zr, voltages at nodes 2, 3, 4, and 5 are carefully driven in order to activate the transistors 100, 101, 102 and 103 to the appropriate levels. Determining the appropriate levels involves specialized control logic, which can be implemented as illustrated in the N driver control circuit 105.

In the illustrated embodiment, the output voltage swing across nodes 6 and 7 can be set using the current Iref produced by current source 112. The current Iref, passes through impedance element 115 which has the same characteristics as elements 106 and 107. Some or all of this current will be absorbed by transistor 111, depending on the gate voltage at node 10. transistor 111 is matched to transistors 100 and 101.

The gate voltage at node 10 is determined by variable gain amplifier 110 which has its input tied to logic 1 (i.e. Vdd in the illustrated embodiment) and produces some output voltage. If this output voltage at node 10 is insufficient to activate transistor 111 sufficiently to sink all of the current Iref, voltage at node 12 will rise as the drain-to-source voltage of transistor 111 rises. Conversely, if the output voltage at node 10 is increased sufficiently (i.e. the gate-to-source voltage of the transistor 111 is sufficiently large) so that the transistor 111 can source all of the current from 112, the voltage at node 12 will fall as the drain-to-source voltage of transistor 111 decreases.

The voltage at node 12 is compared against a reference voltage Vref. When the voltage at node 12 is higher than Vref the comparator 113 outputs a high voltage signal on node 13. When the voltage at node 12 is lower than Vref the comparator 113 outputs a low voltage signal on node 13. As an example, a high voltage signal can have a value equal to Vdd and a low voltage signal can have a value equal to Vss. In many embodiments, Vref is set to be (Vdd+Vss)/2. In other embodiments, the Vref can be any value appropriate to the application.

The voltage at node 13 is detected by a sensing circuit 114. The sensing circuit can be implemented in a variety of ways including but not limited to a combinatorial network of logic gates and/or analog circuits. The sensing circuit 114 is configured to adjust voltage or current at node 9 as a function of the input at node 13. If the voltage at node 13 is consistently high, the sensing circuit determines that the transistor 111 is not sinking enough current. Therefore, the sensing circuit increases the voltage or current at node 9, which increases the amplification of variable amplifier 110 such that the voltage at gate 10 of the transistor 111 is increased. Conversely, if the sensing circuit 114 determines that the input voltage at node 13 is consistently low, the sensing circuit determines that the transistor 111 is sinking too much current. Therefore the sensing circuit decreases the voltage or current at node 9, which decreases the amplification of variable amplifier 110 such that the voltage at the gate 10 of the transistor 110 is decreased.

When the gain of the variable amplifier 110 is set so that the voltage at node 10 is appropriate such that transistor 111 is sinking the appropriate amount of current (i.e. Iref) and voltage at node 12 is close to or matches Vref, the voltage at node 13 will "limit cycle" or oscillate between high and low values. The sensing circuit 114 can detect this occurrence and determine that voltage or current at node 9 is appropriately set so that the drain-to-source voltage of the transistor 111 and the voltage drop across the impedance at Iref equal Vref and can leave the voltage at the gate 10 of transistor 111 unchanged. Sensing circuits in accordance with embodiments of the invention are discussed further below.

The gain of the variable amplifier 110 determined by the sensing circuit 114 is used to control the activation of the transistors 100 and 101 in the line driver circuit. The variable amplifier 109 is used to activate transistors 100 and 101. Because variable gain amplifier 109 is matched to variable gain amplifier 110, the amplification level of variable gain amplifier 109 can be set by node 9 to the same amplification level as variable gain amplifier 110 so that, depending on the data input, one of the transistors 101 and 100 is activated in the same way as transistor 111 and the other transistor is activated to operate in the inverse manner. Therefore, when the nominal voltage at node 12 matches Vref, the transistors 100 and 101 will be controlled by the variable gain amplifier 109 so that, assuming the transistors 102 and 103 are appropriately controlled, the magnitude of the current flowing through the matched impedances 106, 107 (i.e. the voltage drop across the matched impedances) is matched to Iref and the voltage at node 8 is matched to Vref. The direction of the current flow is determined by the digital data input. The user defined digital data inputs are applied at node 1 in the form of V1 and V2 representing 1's and 0's. For our example, V1=Vdd and V2=Vss. These signals are in turn converted by the variable amplifier 109 to the appropriate levels to drive the transistors 100 and 101 in the manner described above. Because the N driver control circuit 105 sets the appropriate amplification of the variable gain amplifier 109 as described previously, the voltage swing across nodes 6 and 7 is determined by the user specified current Iref. As is noted above, the activation of the transistors 100 and 101 is performed in cooperation with activation of the transistors 102 and 103. The activation of p-type transistors in low headroom driver circuits using P driver control circuit in accordance with embodiments of the invention is discussed further below.

Self-Regulation of Common Mode Voltage Using a P Driver Control Circuit

The N driver control circuit 105 illustrated in FIG. 3 sets the magnitude of the voltage swing across impedance elements 106 and 107 by controlling the current flowing through the matched impedance elements. The P driver control circuit regulates the voltage between the two elements at node 8, defined as the common mode voltage, to a user defined level by judicious application of voltage to the gates of the PFET transistors 102 and 103 (i.e. nodes 4 and 5) using a P driver control circuit 104. In many embodiments, the common mode voltage is set to Vref by the P driver control circuit 104. When the common mode voltage is set to Vref by the P driver control circuit 104, the current flowing through the matched impedances 106 and 107 is typically matched to Iref.

Figure 4:
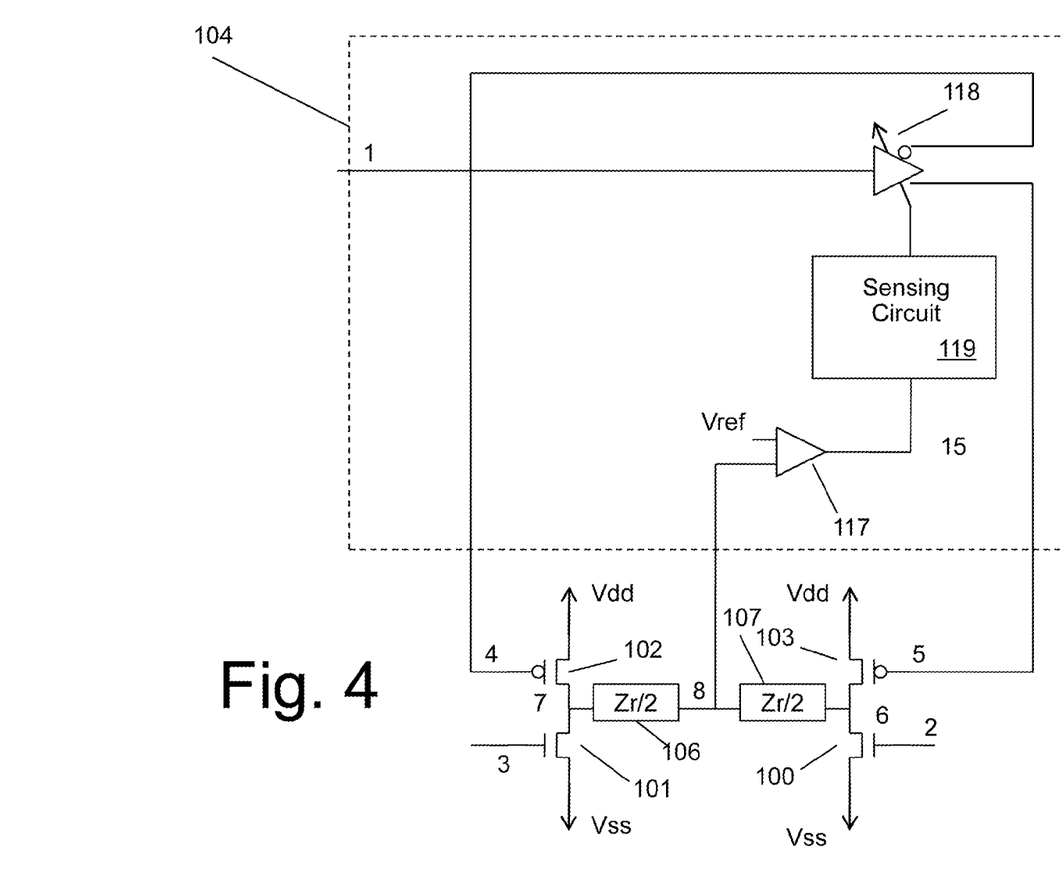
FIG. 4 is a semi-schematic circuit diagram of a line driver circuit illustrating a P driver control circuit in accordance with an embodiment of the invention.

A P driver control circuit in accordance with an embodiment of the invention is illustrated in FIG. 4. The P driver control circuit 104 determines the appropriate levels to drive the PFET devices 102 and 103 such that they match the activity of the NFET devices 100 and 101, which are controlled by the N driver control circuit. Additionally, the common mode voltage at node 8 can be set to a user defined level and maintained automatically.

Data is provided to a variable gain amplifier 118. In the illustrated embodiment, it is assumed a "1" corresponds to Vdd and a "0" corresponds to Vss. However, other values appropriate to a specific application can also be utilized. The variable gain amplifier 118 can output an amplified voltage on node 5 to drive the PFET 103. The variable amplifier 118 also produces the appropriate inverse voltage at node 4 such that the PFET 102 operates in an inverse manner to the PFET 103. Depending on the application of "1" or "0" at the digital data input 1, the PFETS 102 and 103 are turned ON or OFF routing a controlled current from node 7 to 6 or 6 to 7. This matches the operation of the NFETs 100 and 101, which are controlled by a N driver control circuit as described above.

The variable gain amplifier 118 amplifies the data at node 1 based on the control signal at node 15. The signal at node 15 is determined by a comparator 117 and a sensing circuit 119, where the common mode voltage at node 8 is compared with a reference voltage Vref. Vref is defined by the user and, in the illustrated embodiment, is set to (Vdd+Vss)/2. If the common mode voltage at node 8 is greater than Vref, the voltage or current at the output 115 of the comparator 117 decreases and the sensing circuit 119 decreases the gain of the variable amplifier 118 thereby reducing the control voltage at the gate 5 of transistor 103 to increase the drain-to-source voltage of transistor 103 at Iref. Likewise, if the common mode voltage at node 8 is less than Vref, voltage or current at the output 15 of the comparator 117 increases and the sensing circuit 119 increases the gain of the variable amplifier 118, thereby increasing the control voltage at the gate 5 of transistor 103 to decrease the drain-to-source voltage of transistor 103 when the transistor 103 is sinking Iref. The second output of the variable gain amplifier is configured so that the voltage at the gate 4 of transistor 102 is the inverse of voltage at the gate 5 of transistor 103 so the control voltage at the gate 4 of transistor 102 is also increased or reduced based on the comparison of the voltage at node 8 with Vref. The sensing circuit 119 can be implemented in a similar manner to the sensing circuits described above with respect to the N driver control circuit illustrated in FIG. 3.

The N driver control circuit and the P driver control circuit together allow the user to define a specific voltage swing across output nodes 6 and 7. Additionally, the user can specify the common mode voltage between the two elements 106 and

107. The functions of the N driver control circuit and the P driver control circuit, however, can be reversed as is discussed further below.

Alternative PFET Driver Control Circuit

The pairs of transistors to which the driver control circuits shown in FIGS. 3 and 4 are connected can be reversed resulting in identical operation with slight modification to the driver control circuits. An alternative N driver control circuit 105a determines the common mode voltage and an alternative P driver control circuit 104a dictates the output voltage swing.

Figure 5:
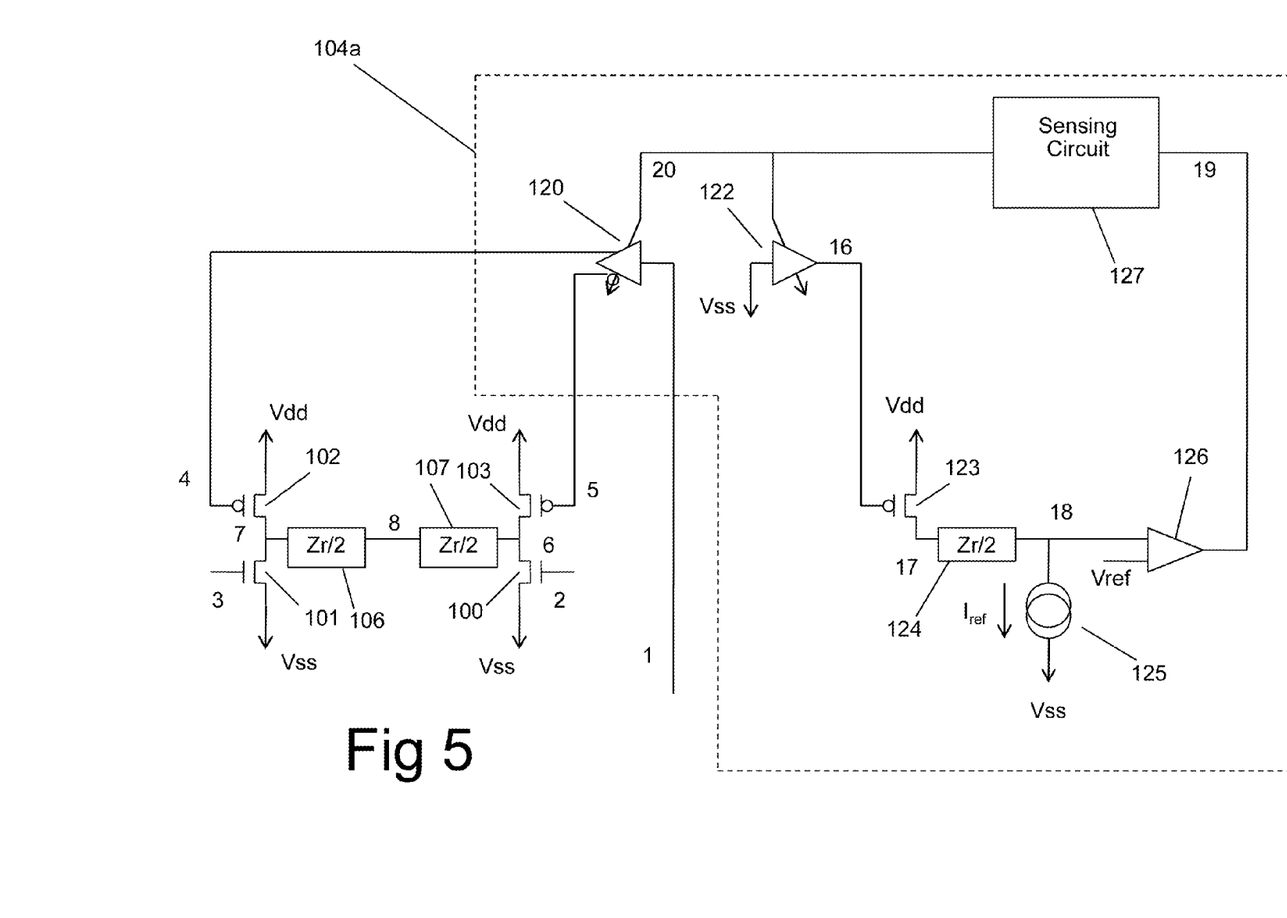
FIG. 5 is a semi-schematic circuit diagram of a line driver circuit illustrating an alternative P driver control circuit in accordance with an alternate embodiment of the invention.

FIG. 5 shows the line driver circuit with a more detailed view of the alternative P driver control circuit 104a. In operation, the line driver circuit is configured to generate a positive or negative voltage across nodes 6 and 7 based upon a digital data input sequence of 1's and 0's. A 1 corresponds to a positive voltage across the load of Zr and a 0 corresponds to a negative voltage. The inverse situation can also be used. To accommodate a user's desire for a specific voltage swing across the load Zr, voltages at nodes 2, 3, 4, and 5 can be driven in order to activate the transistors 100, 101, 102 and 103 to the appropriate levels. Determining the appropriate levels can involve control logic such as the alternative P driver control circuit 104a illustrated in FIG. 5.

A desired output voltage swing across nodes 6 and 7 is set using the current Iref produced by current sink 125. The drawn current Iref, flows through the impedance element 124 which is identical to elements 106 and 107. Some or all of the sunk current is sourced by transistor 123, depending on the gate voltage at node 16. Transistor 123 is matched to transistors 102 and 103.

The gate voltage at node 16 is determined by a variable gain amplifier 122, which has its input tied to logic 0 (i.e. Vss in the illustrated embodiment) and produces an output voltage controlled by the voltage or current at node 20. If the output voltage at node 16 is insufficient to activate transistor 123 sufficiently to source all of the current Iref, the drain-to-source voltage of the transistor 123 will increase and the voltage at node 18 will fall. Conversely, if the output voltage at node 16 is low enough to source all or more of the current from 125, the drain-to-source voltage of the transistor 123 will decrease and the voltage at node 18 will rise.

In the illustrated embodiment, the voltage at node 18 is compared against a reference voltage Vref. In several embodiments, Vref is (Vdd+Vss)/2. When the voltage at node 18 is higher than Vref the comparator 126 outputs a high voltage signal on node 19. When the voltage at node 18 is lower than Vref, the comparator 126 outputs a low voltage signal on node 19. As an example, a high voltage signal can be considered Vdd and a low voltage signal Vss.

The voltage at node 19 is detected by a sensing circuit 127. The sensing circuit can be a combinatorial network of logic gates or it can be an analog circuit. In either case the sensing circuit 127 will adjust voltage or current at node 20 as a function of the input at node 19.

If the voltage at node 19 is consistently high, the sensing circuit 127 determines that the transistor 123 is sourcing too much current. Therefore, the sensing circuit adjusts the voltage or current at node 20, which adjusts the amplification of variable amplifier 122 so that the gate of the transistor 123 is less asserted and the drain-to-source voltage of the transistor 123 is increased.

Conversely, if the sensing circuit 127 determines that the input voltage at node 19 is consistently low, the sensing circuit 127 determines that the transistor 123 is sourcing too little current. Therefore the sensing circuit adjusts the voltage or current at node 20, which adjusts the amplification of 122 so that that the transistor 123 is asserted more and the drain-to-source voltage of the transistor 123 is increased.

When the voltage at node 16 is appropriate such that the transistor 123 is sourcing the appropriate amount of current from Iref, the voltage at node 19 will "limit cycle" or oscillate between high and low values. The sensing circuit detects this occurrence and determines that voltage or current at node 16 is appropriately set, leaving it unchanged. Variable gain amplifier 120 is identical to the variable gain amplifier 122, therefore, the amplification level of variable gain amplifier 120 is set by node 20 to be the same as the amplification level of variable gain amplifier 122.

User defined inputs can be applied at node 1 in the form of voltages V1 and V2 representing 1's and 0's. In the illustrated embodiment, V1=Vdd and V2=Vss. These signals are in turn amplified by the variable gain amplifier 120 to the appropriate levels to drive transistor 103. Variable gain amplifier 120 also produces the inverse voltage and drives gate 4 of transistor 102 so that it is operating in an inverse manner as transistor 103. Due to the P driver control circuit 104a setting the appropriate amplification of 120 as described previously, the voltage swing across node 6 and 7 can be controlled by setting the value of Iref.

Alternative Self-Regulation of Common Mode Voltage

The alternative P driver control circuit 104a shown in FIG. 5 can be utilized to set the level of voltage swing across impedance elements 106 and 107. The voltage between the two elements at node 8, defined as common mode voltage, can also be controlled. This is done by judicious application of voltage to the gates 2 and 3 of transistors 100 and 101.

Figure 6:
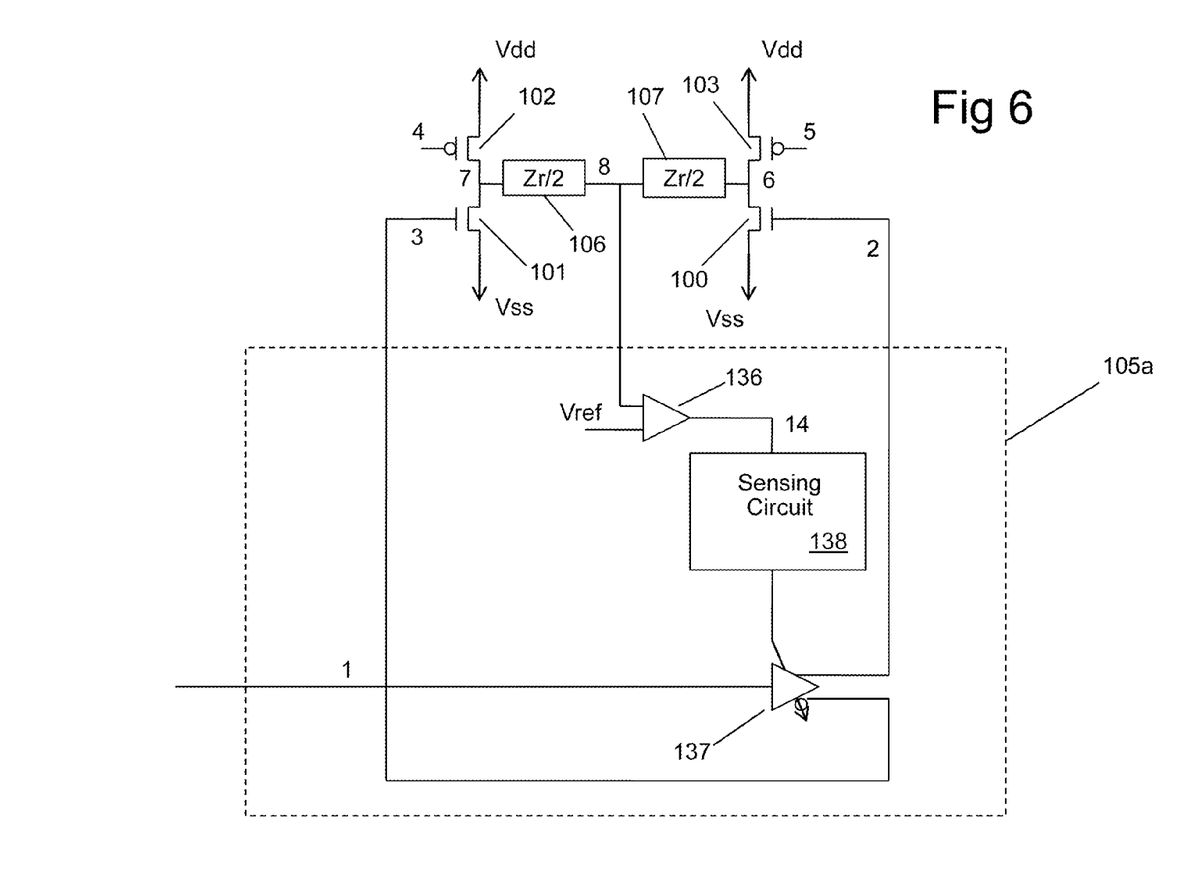
FIG. 6 is a semi-schematic circuit diagram of a line driver circuit illustrating an alternative N Driver control circuit in accordance with an alternate embodiment of the invention.

An alternative N driver control circuit that can be utilized to control the common mode voltage of a low headroom driver circuit in accordance with an embodiment of the invention is illustrated in FIG. 6. In the illustrated embodiment, the N driver control circuit 105a determines the appropriate levels to drive the NFET devices 100 and 101 such that they match the activity of the PFET devices 102 and 103, which are controlled by the P driver control circuit 104a illustrated in FIG. 5. Additionally, the common mode voltage at node 8 can be set to a user defined level and maintained automatically.

In the illustrated embodiment, a data signal is provided to a variable amplifier 137. For our example, it is assumed a "1" corresponds to Vdd and a "0" corresponds to Vss. However, these levels can be set by the user. The variable amplifier 137 outputs an amplified voltage on node 2 that drives the NFET 100. The variable amplifier 137 can also produce the appropriate inverse voltage at node 3 such that NFET 101 is operating in an inverse manner as 100. Depending on the application of a "1" or "0" data value at the digital data input 1, the NFETs 100 and 101 are turned ON or OFF routing current from node 7 to 6 or 6 to 7. This matches the operation of the PFETs 102 and 103, which can be controlled using a P driver control circuit similar to the P driver control circuit 104a illustrated in FIG. 5.

The variable gain amplifier 137 amplifies the data at node 1 based on the control signal 14 output by a comparator 136. The comparator 136 compares the common mode voltage at node 8 with a reference voltage Vref. Vref can be defined by the user. In many embodiments, Vref is set to (Vdd+Vss)/2. If the common mode voltage at node 8 is greater than Vref, voltage and current at the output 14 of comparator 136 increases and a sensing circuit increases the gain of the variable amplifier 137 thereby increasing the control voltage at the gate 2 of transistor 100, which can result in a decrease in the drain-to-source voltage of the transistor 100. Likewise, if the common mode voltage at node 8 is less than Vref, voltage and current at the output 14 of the comparator 136 decreases and the sensing circuit 138 decreases the gain of the variable gain amplifier 137 thereby decreasing the control voltage at the gate 2 of transistor 100, which can result in an increase in the drain-to-source voltage of the transistor 100. The variable gain amplifier 137 is configured to produce a second inverse input that is provided to the gate 3 of transistor 101 so that it is operating in an inverse manner as transistor 100. Accordingly, the control voltage at node 2 is also increased or reduced based on the comparison of the voltage at node 8 with Vref. The sensing circuit 138 can be implemented in a similar manner to the sensing circuits described above with respect to the N Driver Control Circuit illustrated in FIG. 5.

The alternative N driver control circuit 105a and alternative P driver control circuit 104a together allow the user to define a specific voltage swing across output nodes 6 and 7. Additionally, the user can specify the common mode voltage between the two elements 106 and 107.

Variable Amplifier Implementations

Figure 7:
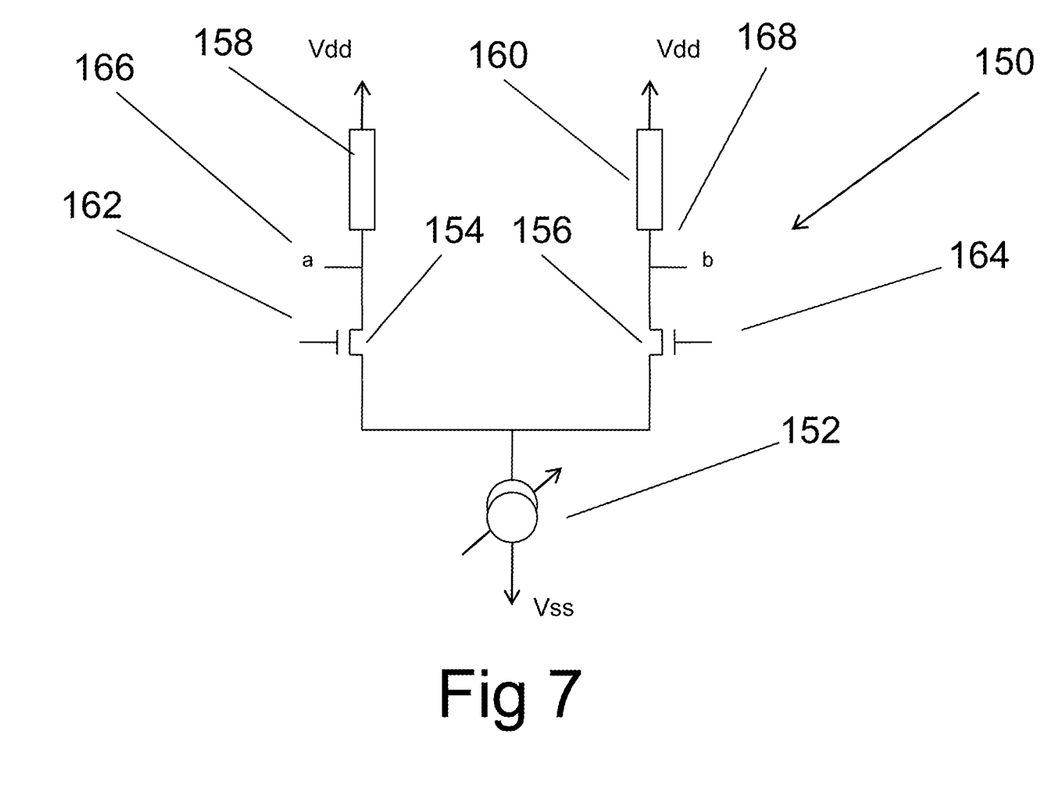
FIG. 7 is a semi-schematic circuit diagram of a variable gain amplifier that can be utilized in driver control circuits in low headroom line driver circuits in accordance with embodiments of the invention.

A variable amplifier that can be utilized in the implementation of a low headroom driver circuit in accordance with an embodiment of the invention is illustrated in FIG. 7. The variable amplifier 150 includes a variable current sink 152 that sinks current from a pair of transistors 154 and 156 through a pair of impedances 158 and 160. The signals 162 and 164 applied to the gates of the transistors 154 and 156 are differential (i.e. when one is logic "1", the other is logic "0") and the gain of the variable amplifier is controlled by the variable current sink 152. As such, the value of the outputs 166 and 168 is controlled by the control signal that sets the variable amplifier's gain. Although a specific implementation of a variable amplifier is illustrated in FIG. 7, any of a variety of variable gain amplifier implementations can be utilized in accordance with embodiments of the invention.

Sensing Circuit

Figure 8:
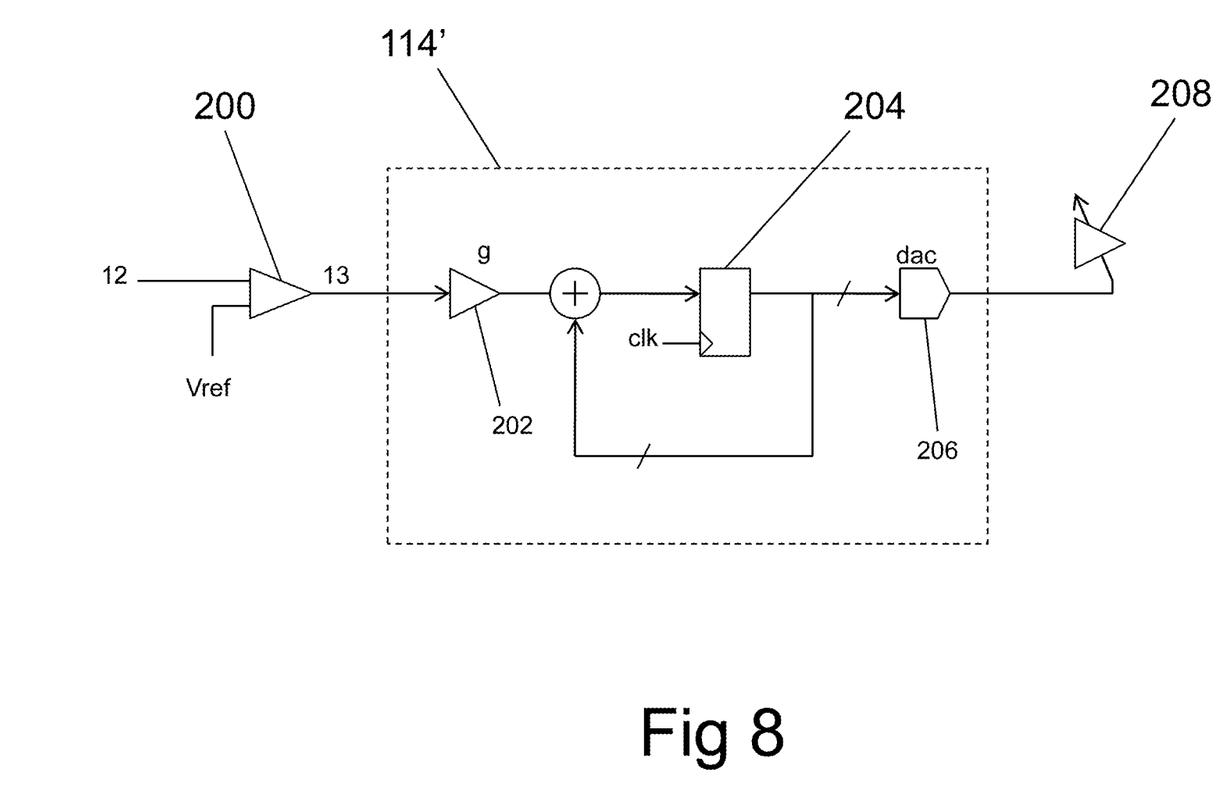
FIG. 8 is a semi-schematic circuit diagram of a sensing circuit that can be utilized in driver control circuits in low headroom line driver circuits in accordance with an embodiment of the invention.

Several of the driver control circuits discussed above incorporate a sensing circuit that produces a voltage or current signal that controls the gain of a variable gain amplifier in response to an input voltage. A sensing circuit in accordance with an embodiment of the invention is illustrated in FIG. 8. The sensing circuit 114' receives the output of a comparison between a voltage and a reference voltage. In the illustrated embodiment, a comparator 200 outputs a "1" if the voltage exceeds the reference voltage and a "0" if the voltage is below the reference voltage. The output of the comparator 200 is scaled (202) by a gain factor "g" and the scaled value is added to an integrator 204. The top most significant bits of the integrator are provided to a digital to analog converter 206, which converts the numerical value to an analog voltage or current that adjusts the gain of a variable gain amplifier 208. By using the most significant bits of the output of the integrator, the output of the sensing circuit can achieve steady state during the limit cycle of the input voltage.

The circuit illustrated in FIG. 8 is effectively an accumulator with programmable gain. The gain is set so that the digital to analog converter output does not react too quickly to changes in the input voltage. For example, the gain could be $1/100$. Although a specific sensing circuit is illustrated in FIG. 8, the circuit can be replaced by other analog circuits, or a state machine that produce a voltage or current signal that can be used to control the gain of a variable gain amplifier in response to an input voltage in accordance with embodiments of the invention.

Although the present invention has been described in certain specific aspects, many additional modifications and variations would be apparent to those skilled in the art. It is therefore to be understood that the present invention may be practiced otherwise than specifically described. Thus, embodiments of the present invention should be considered in all respects as illustrative and not restrictive.

What is claimed is:

1. A line driver circuit configured to regulate output voltage and common mode voltage, comprising:
   a first transistor and a second transistor, where the first and second transistors are matched;
   a third transistor and a fourth transistor, where the third and fourth transistors are matched;
   a first impedance and a second impedance, where the first and second impedances are matched;
   a first driver control circuit configured to apply control signals to the gates of the first and second transistors in response to a digital input; and
   a second driver control circuit configured to apply control signals to the gates of the third and fourth transistors in response to the digital input;
   wherein the first and third transistors are configured as a pair of stacked transistors connected between a first voltage supply (Vdd) and a second voltage supply (Vss);
   wherein the second and fourth transistors are configured as a pair of stacked transistors connected between the first voltage supply (Vdd) and the second voltage supply (Vss);
   wherein the matched impedances are connected in series between a node formed by the connection between the first and third transistors and a node formed by the connection between the second and fourth transistors;
   wherein the first driver control circuit and the second driver control circuit regulate the voltage drop across the pair of matched impedances and the common mode voltage at a node between the first and second impedances; and
   wherein the first driver control circuit and the second driver control circuit are configured to regulate the line driver circuit such that the current flowing through the impedances is matched to a reference current (Iref) and the common mode voltage is matched to a reference voltage (Vref).

2. The line driver circuit of claim 1, wherein:
   the first driver control circuit and the second driver control circuit are configured so that the first and fourth transistors form a current path between the first voltage supply (Vdd) and the second voltage supply (Vss) via the matched impedances when the digital input is a first value; and
   the first driver control circuit and second driver control circuit are configured so that the second and third transistors form a current path between the first voltage supply (Vdd) and the second voltage supply (Vss) via the matched impedances when the digital input is a second value.

3. The line driver circuit of claim 1, wherein:
   the first and second transistors are n-type FETs; and
   the third and fourth transistors are p-type FETs.

4. The line driver circuit of claim 1, wherein:
   the first and second transistors are p-type FETs; and
   the third and fourth transistors are n-type FETs.

5. The line driver circuit of claim 1, wherein:
   the third, and fourth transistors are n-type FETS;
   the second driver control circuit is configured to control the gain of the variable gain amplifier to increase the magnitude of the control signal applied to the gates of third and fourth transistors when the common mode voltage is greater than the reference voltage (Vref) for a predetermined period of time; and
   the second driver control circuit is configured to control the gain of the variable gain amplifier to decrease the magnitude of the control signal applied to the gates of third and fourth transistors when the common mode voltage is less than the reference voltage (Vref) for a predetermined period of time.

6. The line driver circuit of claim 1, wherein:
the first driver control circuit comprises a current supply, a third impedance matched to the first and second impedances, and a fifth transistor matched to the first and second transistors;
the current supply, third impedance, and fifth transistor are configured so that current flows from the current supply through the third impedance and the fifth transistor, and the fifth transistor controls the amount of current that flows through the third impedance and the fifth transistor;
the first driver control circuit is configured to control the signal applied to the gate of the fifth transistor so that the current flowing through the third impedance and the fifth transistor matches the reference current (Iref); and
the first driver control circuit is configured to use the signal applied to the gate of the fifth transistor to control the magnitude of the signal applied to the gates of the first and second transistors in response to the digital input.

7. The line driver circuit of claim 6, wherein:
the first driver control circuit further comprises first and second variable gain amplifiers, where the first and second variable gain amplifiers are matched;
the input to the first variable gain amplifier is the digital input;
a first output of the first variable gain amplifier is configured to be provided to the gate of the first transistor;
a second output of the first variable gain amplifier is configured to be provided to the gate of the second transistor, where the second output causes the second transistor to operate in an inverse manner to the first transistor;
the output of the second variable gain amplifier is configured to be provided to the gate of the fifth transistor;
the first driver control circuit is configured to control the signal applied to the gate of the fifth transistor by controlling the gain of the second variable gain amplifier; and
the first driver control circuit is configured to control the gain of the first variable gain amplifier to match the gain of the second variable gain amplifier.

8. The line driver circuit of claim 7, wherein the first driver control circuit further comprises a comparator configured to compare the voltage drop across the third impedance and the fifth transistor to the reference voltage (Vref).

9. The line driver circuit of claim 8, wherein:
the first, second, and fifth transistors are n-type FETs;
the current supply is a current source;
the first transistor is connected between the third transistor and the second voltage supply (Vss);
the second transistor is connected between the fourth transistor and the second voltage supply (Vss);
the first driver control circuit is configured to increase the gain of the second variable gain amplifier when the voltage drop across the third impedance and fifth transistor is less than the reference voltage (Vref) for a predetermined period of time; and
the first driver control circuit is configured to decrease the gain of the second variable gain amplifier when the voltage drop across the third impedance and fifth transistor is greater than the reference voltage (Vref) for a predetermined period of time.

10. The line driver circuit of claim 9, wherein:
the third, and fourth transistors are p-type FETs;
the second driver control circuit comprises a variable gain amplifier and a comparator;
the input to the variable gain amplifier is the digital input;
a first output of the first variable gain amplifier is configured to be provided to the gate of the fourth transistor;
a second output of the first variable gain amplifier is configured to be provided to the gate of the third transistor, where the second output causes the third transistor to operate in an inverse manner to the fourth transistor;
the comparator is configured to compare the common mode voltage of the line driver circuit to the reference voltage (Vref);
the second driver control circuit is configured to control the gain of the variable gain amplifier to decrease the magnitude of the control signal applied to the gates of third and fourth transistors when the common mode voltage is greater than the reference voltage (Vref) for a predetermined period of time; and
the second driver control circuit is configured to control the gain of the variable gain amplifier to increase the magnitude of the control signal applied to the gates of third and fourth transistors when the common mode voltage is less than the reference voltage (Vref) for a predetermined period of time.

11. The line driver circuit of claim 8, wherein:
the first, second, and fifth transistors are p-type;
the current supply is a current sink;
the first transistor is connected between the first voltage supply (Vdd) and the third transistor;
the second transistor is connected between the first voltage supply (Vdd) and the fourth transistor;
the first driver control circuit is configured to decrease the gain of the second variable gain amplifier when the voltage drop across the third impedance and fifth transistor is less than the reference voltage (Vref) for a predetermined period of time; and
the first driver control circuit is configured to increase the gain of the second variable gain amplifier when the voltage drop across the third impedance and fifth transistor is greater than the reference voltage (Vref) for a predetermined period of time.

12. The line driver circuit of claim 11, wherein:
the third, and fourth transistors are n-type FETs;
the second driver control circuit comprises a variable gain amplifier and a comparator;
the input to the variable gain amplifier is the digital input;
a first output of the first variable gain amplifier is configured to be provided to the gate of the fourth transistor;
a second output of the first variable gain amplifier is configured to be provided to the gate of the third transistor, where the second output causes the third transistor to operate in an inverse manner to the fourth transistor;
the comparator is configured to compare the common mode voltage of the line driver circuit to the reference voltage (Vref);
the second driver control circuit is configured to control the gain of the variable gain amplifier to increase the magnitude of the control signal applied to the gates of third and fourth transistors when the common mode voltage is greater than the reference voltage (Vref) for a predetermined period of time; and
the second driver control circuit is configured to control the gain of the variable gain amplifier to decrease the magnitude of the control signal applied to the gates of third and fourth transistors when the common mode voltage is less than the reference voltage (Vref) for a predetermined period of time.

13. The line driver circuit of claim 1, wherein:
the second driver control circuit comprises a variable gain amplifier and a comparator;
a first output of the first variable gain amplifier is configured to be provided to the gate of the fourth transistor;
a second output of the first variable gain amplifier is configured to be provided to the gate of the third transistor, where the second output causes the third transistor to operate in an inverse manner to the fourth transistor;
the comparator is configured to compare the common mode voltage of the line driver circuit to the reference voltage (Vref); and
the second driver control circuit is configured to control the magnitude of the signals applied to the gates of the third and fourth transistors so that the common mode voltage matches the reference voltage (Vref).

14. The line driver circuit of claim 1, wherein:
the third, and fourth transistors are p-type FETs;
the second driver control circuit is configured to control the gain of the variable gain amplifier to decrease the magnitude of the control signal applied to the gates of third and fourth transistors when the common mode voltage is greater than the reference voltage (Vref) for a predetermined period of time; and
the second driver control circuit is configured to control the gain of the variable gain amplifier to increase the magnitude of the control signal applied to the gates of third and fourth transistors when the common mode voltage is less than the reference voltage (Vref) for a predetermined period of time.

15. A line driver circuit configured to regulate output voltage and common mode voltage, comprising:
a first transistor and a second transistor, where the first and second transistors are matched;
a third transistor and a fourth transistor, where the third and fourth transistors are matched;
a first impedance and a second impedance, where the first and second impedances are matched;
a first driver control circuit configured to apply control signals to the gates of the first and second transistors in response to a digital input; and
a second driver control circuit configured to apply control signals to the gates of the third and fourth transistors in response to the digital input;
wherein the first and third transistors are configured as a pair of stacked transistors connected between a first voltage supply (Vdd) and a second voltage supply (Vss);
wherein the second and fourth transistors are configured as a pair of stacked transistors connected between the first voltage supply (Vdd) and the second voltage supply (Vss);
wherein the matched impedances are connected in series between a node formed by the connection between the first and third transistors and a node formed by the connection between the second and fourth transistors;
wherein the first driver control circuit comprises a current supply, a third impedance matched to the first and second impedances, and a fifth transistor matched to the first and second transistors;
wherein the current supply, third impedance, and fifth transistor are configured so that current flows from the current supply through the third impedance and the fifth transistor, and the fifth transistor controls the amount of current that flows through the third impedance and the fifth transistor;
wherein the first driver control circuit is configured to control the signal applied to the gate of the fifth transistor so that the current flowing through the third impedance and the fifth transistor matches a reference current (Iref);
wherein the first driver control circuit is configured to use the signal applied to the gate of the fifth transistor to control the magnitude of the signal applied to the gates of the first and second transistors in response to the digital input;
wherein the second driver control circuit comprises a variable gain amplifier and a comparator;
wherein a first output of the first variable gain amplifier is configured to be provided to the gate of the fourth transistor;
wherein a second output of the first variable gain amplifier is configured to be provided to the gate of the third transistor, where the second output causes the third transistor to operate in an inverse manner to the fourth transistor;
wherein the comparator is configured to compare the common mode voltage of the line driver circuit to a reference voltage (Vref); and
wherein the second driver control circuit is configured to control the magnitude of the signals applied to the gates of the third and fourth transistors so that the common mode voltage matches the reference voltage (Vref).

* * * * *